(12) United States Patent
Nakatsutsumi

(10) Patent No.: US 12,267,057 B2
(45) Date of Patent: Apr. 1, 2025

(54) MULTILAYER FILTER

(71) Applicant: TDK Corporation, Tokyo (JP)

(72) Inventor: Jun Nakatsutsumi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 330 days.

(21) Appl. No.: 18/147,044

(22) Filed: Dec. 28, 2022

(65) Prior Publication Data

US 2023/0253944 A1    Aug. 10, 2023

(30) Foreign Application Priority Data

Feb. 8, 2022  (JP) .................................. 2022-017773

(51) Int. Cl.
| | |
|---|---|
| *H03H 7/01* | (2006.01) |
| *H01F 27/28* | (2006.01) |
| *H01F 27/29* | (2006.01) |
| *H01F 27/32* | (2006.01) |
| *H03H 1/00* | (2006.01) |

(52) U.S. Cl.
CPC ....... *H03H 7/0115* (2013.01); *H01F 27/2852* (2013.01); *H01F 27/29* (2013.01); *H01F 27/32* (2013.01); *H03H 2001/0085* (2013.01)

(58) Field of Classification Search
CPC ...... H01F 17/0013; H01F 27/29; H01F 27/32; H01F 27/2852; H01F 2017/0026; H03H 7/0115; H03H 2001/0085
See application file for complete search history.

(56) References Cited

U.S. PATENT DOCUMENTS

| | | | |
|---|---|---|---|
| 2010/0026419 A1 | 2/2010 | Hara et al. | |
| 2018/0145651 A1* | 5/2018 | Kitami | .................... H03H 1/00 |
| 2021/0257984 A1* | 8/2021 | Sato | .................... H03H 7/1766 |

FOREIGN PATENT DOCUMENTS

| | | | | |
|---|---|---|---|---|
| CN | 111211752 A | * | 5/2020 | ............... H03H 3/02 |
| JP | 2010-41141 A | | 2/2010 | |

* cited by examiner

*Primary Examiner* — Quan Tra
(74) *Attorney, Agent, or Firm* — Oliff PLC

(57) ABSTRACT

A multilayer filter includes: an element body formed by laminating a plurality of insulator layers; a first inductor and a second inductor; and a wall portion disposed between the first inductor and the second inductor and grounded, wherein at least the second inductor is a vertical winding type inductor of which a winding axis extends in a direction orthogonal to a laminating direction in which the plurality of insulator layers are laminated, a penetrating portion penetrating in a facing direction in which the first inductor and the second inductor face each other is formed in the wall portion, and a size of the penetrating portion in the laminating direction is larger than a size of one insulator layer.

5 Claims, 12 Drawing Sheets

MULTILAYER FILTER

CROSS REFERENCE TO RELATED APPLICATIONS

This application claims priority to Japanese Patent Application No. 2022-017773 filed on Feb. 8, 2022, the entire contents of which are incorporated by reference herein.

TECHNICAL FIELD

The present invention relates to a multilayer filter.

BACKGROUND

As a technique relating to conventional multilayer filters, a multilayer filter described in Japanese Unexamined Patent Publication No. 2010-41141 is known. This multilayer filter includes one inductor and another inductor and its characteristics are adjusted by removing a ground pattern between them and providing an opening.

SUMMARY

Incidentally, in multilayer filters, a vertical winding type inductor may be adopted to obtain high in-band insertion characteristics. The vertical winding type inductor is disposed such that its winding axis extends in a direction orthogonal to a laminating direction. The vertical winding type inductor is likely to be electromagnetically coupled with other adjacent inductors, possibly degrading various characteristics. On the other hand, in a case in which a grounded wall portion or the like is provided between the inductors, magnetic flux of the vertical winding type inductor may be disturbed. In view of this, there has been a demand for improving performance of a multilayer filter by solving these various problems.

The present invention has been made to solve the above problems, and an object thereof of is to provide a multilayer filter of which performance can be improved.

A multilayer filter according to one aspect of the present invention includes: an element body formed by laminating a plurality of insulator layers; a first inductor and a second inductor; and a wall portion disposed between the first inductor and the second inductor and grounded, wherein at least the second inductor is a vertical winding type inductor of which a winding axis extends in a direction orthogonal to a laminating direction in which the plurality of insulator layers are laminated, a penetrating portion penetrating in a facing direction in which the first inductor and the second inductor face each other is formed in the wall portion, and a size of the penetrating portion in the laminating direction is larger than a size of one insulator layer.

In this multilayer filter, at least the second inductor is a vertical winding type inductor of which the winding axis extends in the direction orthogonal to the laminating direction in which the plurality of insulator layers are laminated. By using such a vertical winding coil, the multilayer filter can obtain high in-band insertion loss characteristics. In addition, the multilayer filter includes the wall portion disposed between the first inductor and the second inductor and grounded. Accordingly, electromagnetic coupling between the first inductor and the second inductor can be inhibited. Here, the penetrating portion penetrating in the facing direction in which the first inductor and the second inductor face each other is formed in the wall portion. Also, the size of the penetrating portion in the laminating direction is larger than the size of one insulator layer. Since the wall portion has the large penetrating portion, magnetic flux of the second inductor, which is the vertical winding type inductor, can pass through the penetrating portion. Accordingly, it is possible to prevent the magnetic flux of the second inductor from being obstructed and improve its Q factor. In this way, performance of the multilayer filter can be improved.

Terminal electrodes may be formed on one side of the element body in the laminating direction, the wall portion may have a first portion on one side in the laminating direction from the penetrating portion and a second portion on the other side in the laminating direction from the penetrating portion, and the first portion may be larger than the second portion in the laminating direction. Since the terminal electrodes are formed on the one side of the element body in the laminating direction, there are many electrodes. Accordingly, by enlarging the first portion on the one side of the wall portion in the laminating direction, it is possible to inhibit occurrence of stray capacitance between the electrodes on the one side and the other side of the wall portion.

The first inductor and the second inductor may be in different bands. In this case, the wall portion can inhibit coupling between the inductors of different bands.

One of the first inductor and the second inductor may be a high-band inductor, and the other may be a mid-band inductor. In this case, deterioration of isolation characteristics, which is a problem in so-called multiplexers, can be inhibited.

Terminal electrodes are formed on one side of the element body in the laminating direction, the wall portion has a second portion on the other side in the laminating direction from the penetrating portion, the second inductor has a wiring portion disposed on the other side in the laminating direction, and the wiring portion may overlap the second portion when viewed in the facing direction. In this case, electromagnetic coupling between the wiring portion of the second inductor and the first inductor can be inhibited.

According to the present invention, it is possible to provide the multilayer filter of which performance can be improved.

DETAILED DESCRIPTION

A preferred embodiment of a multilayer filter according to one aspect of the present invention will be described in detail below with reference to the drawings.

First, a configuration of a multilayer filter 1 (an electronic component) according to the present embodiment will be described with reference to FIGS. 1 to 6.

Figure 1:
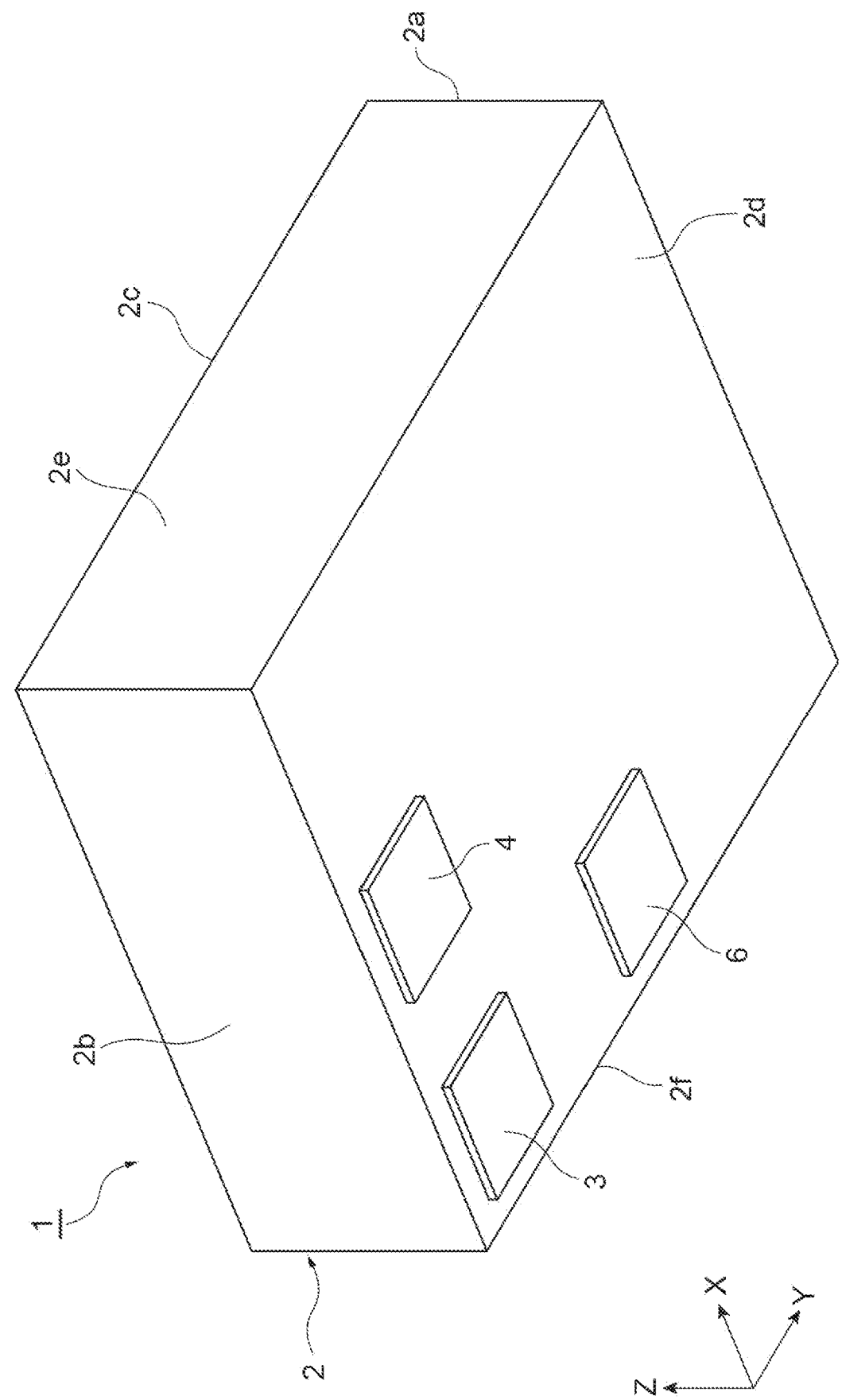
FIG. 1 is a perspective view showing a multilayer filter according to one embodiment.

FIG. 1 is a perspective view showing the multilayer filter 1 according to one embodiment. As the multilayer filter 1, for example, a multiplexer is exemplified. As shown in FIG. 1, the multilayer filter 1 has an element body 2 and terminal electrodes 3, 4, and 6 (terminals).

The element body 2 has a rectangular parallelepiped shape. The element body 2 has, as its outer surfaces, a pair of side surfaces 2a and 2b that face each other, a pair of main surfaces 2c and 2d that extend to connect the pair of side surfaces 2a and 2b to each other and face each other, and a pair of side surfaces 2e and 2f that extend to connect the pair of main surfaces 2c and 2d to each other and face each other. For example, when the multilayer filter 1 is mounted on another electronic device (for example, a circuit board, an electronic component, or the like), which is not shown, the main surface 2d is defined as a surface that faces the other electronic device.

A facing direction of the side surfaces 2a and 2b, a facing direction of the main surfaces 2c and 2d, and a facing direction of the side surfaces 2e and 2f are substantially orthogonal to each other. Also, the rectangular parallelepiped shape may be a rectangular parallelepiped shape with chamfered corner portions and ridge portions, or a rectangular parallelepiped shape with rounded corner portions and ridge portions. In some cases, XYZ coordinates are set for the multilayer filter 1 for explanation. The X axis direction is the facing direction of the side surfaces 2e and 2f. The Y axis direction is the facing direction of the side surfaces 2a and 2b. The Z axis direction is the facing direction of the main surfaces 2c and 2d. The side surface 2e is disposed on a positive side in the X axis direction, and the side surface 2f is disposed on a negative side in the X axis direction. The side surface 2a is disposed on a positive side in the Y axis direction, and the side surface 2b is disposed on a negative side in the Y axis direction. The main surface 2c is disposed on a positive side in the Z axis direction, and the main surface 2d is disposed on a negative side in the Z axis direction.

Figure 4:
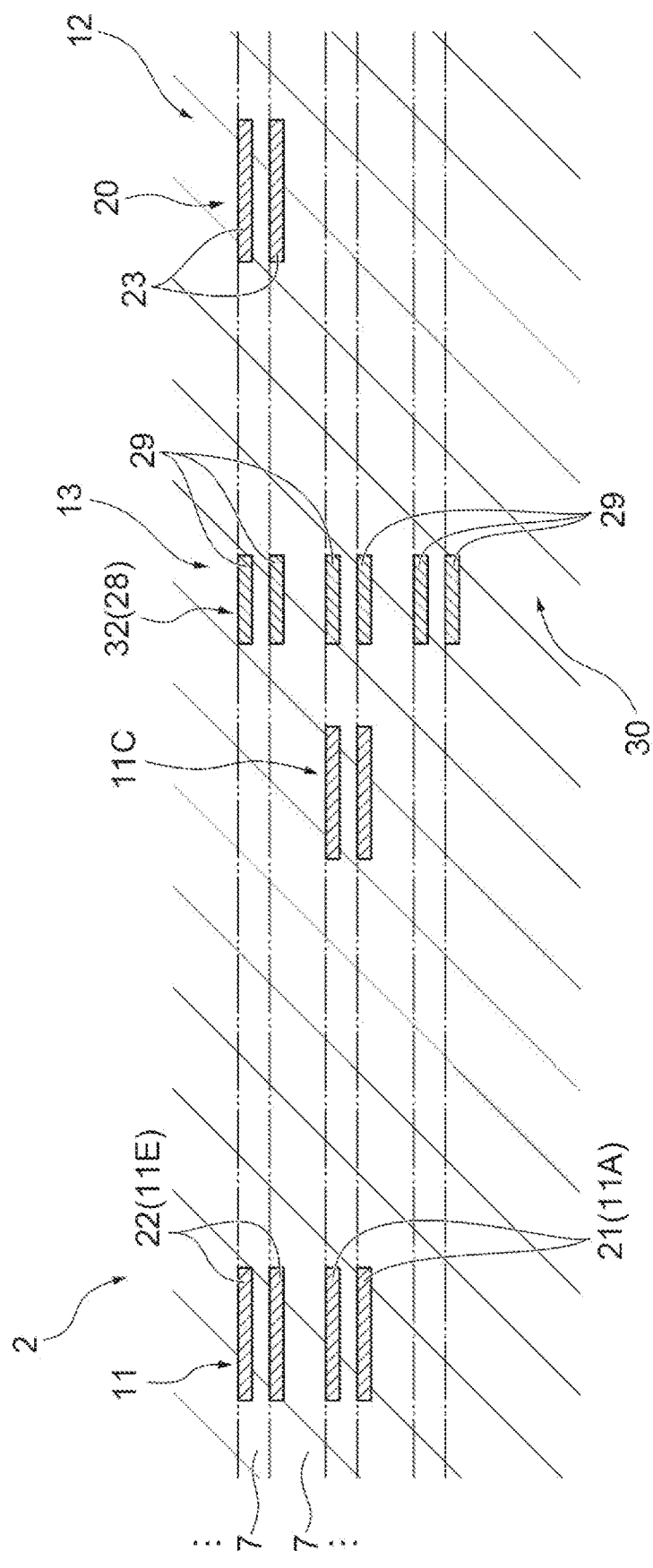
FIG. 4 is an enlarged cross-sectional view along line IV-IV in FIG. 2.

As shown in FIG. 4, the element body 2 is configured by laminating a plurality of insulator layers 7, for example. The insulator layers 7 are laminated in the Z axis direction. That is, a laminating direction of the insulator layers 7 coincides with the facing direction of the main surfaces 2c and 2d of the element body 2. Hereinafter, the direction in which the main surfaces 2c and 2d face each other may be referred to as the "laminating direction." Each of the insulator layers 7 has a substantially rectangular shape. In the actual element body 2, the insulator layers 7 are integrated to such an extent that boundaries between the layers (indicated by two dot chain lines in the figure) cannot be visually recognized. Each of the insulator layers 7 corresponds to one ceramic green sheet before firing.

Each of the insulator layers 7 is configured of, for example, a sintered ceramic green sheet containing a dielectric material (a BaTiO3-based material, a Ba (Ti,Zr)O3-based material, a (Ba,Ca)TiO3-based material, a glass material, an alumina material, or the like).

As shown in FIG. 1, the terminal electrodes 3, 4, and 6 are disposed on the main surface 2d on the negative side in the Z axis direction (one side in the laminating direction). The terminal electrode 3 is disposed near a corner portion of the main surface 2d on the negative side in the Y axis direction and the negative side in the X axis direction. The terminal electrode 4 is disposed at a position of the main surface 2d adjacent to the terminal electrode 3 on the positive side in the X axis direction. The terminal electrode 6 is disposed at a position of the main surface 2d adjacent to the terminal electrode 3 on the positive side in the Y axis direction. Among the terminal electrodes 3, 4, and 6, the terminal electrode 3 is an output terminal and the terminal electrodes 4 and 6 are ground terminals.

Each of the terminal electrodes 3, 4, and 6 (hereinafter sometimes simply referred to as an electrode) contains a conductive material (for example, Ag or Pd). The electrode is configured as a sintered body of a conductive paste containing a conductive material (for example, Ag powder or Pd powder). A plating layer is formed on a surface of the electrode. The plating layer is formed, for example, by electroplating. The plating layer has a layer structure configured of a Cu plating layer, a Ni plating layer, and a Sn plating layer, or a layer structure configured of a Ni plating layer and a Sn plating layer.

Figure 2:
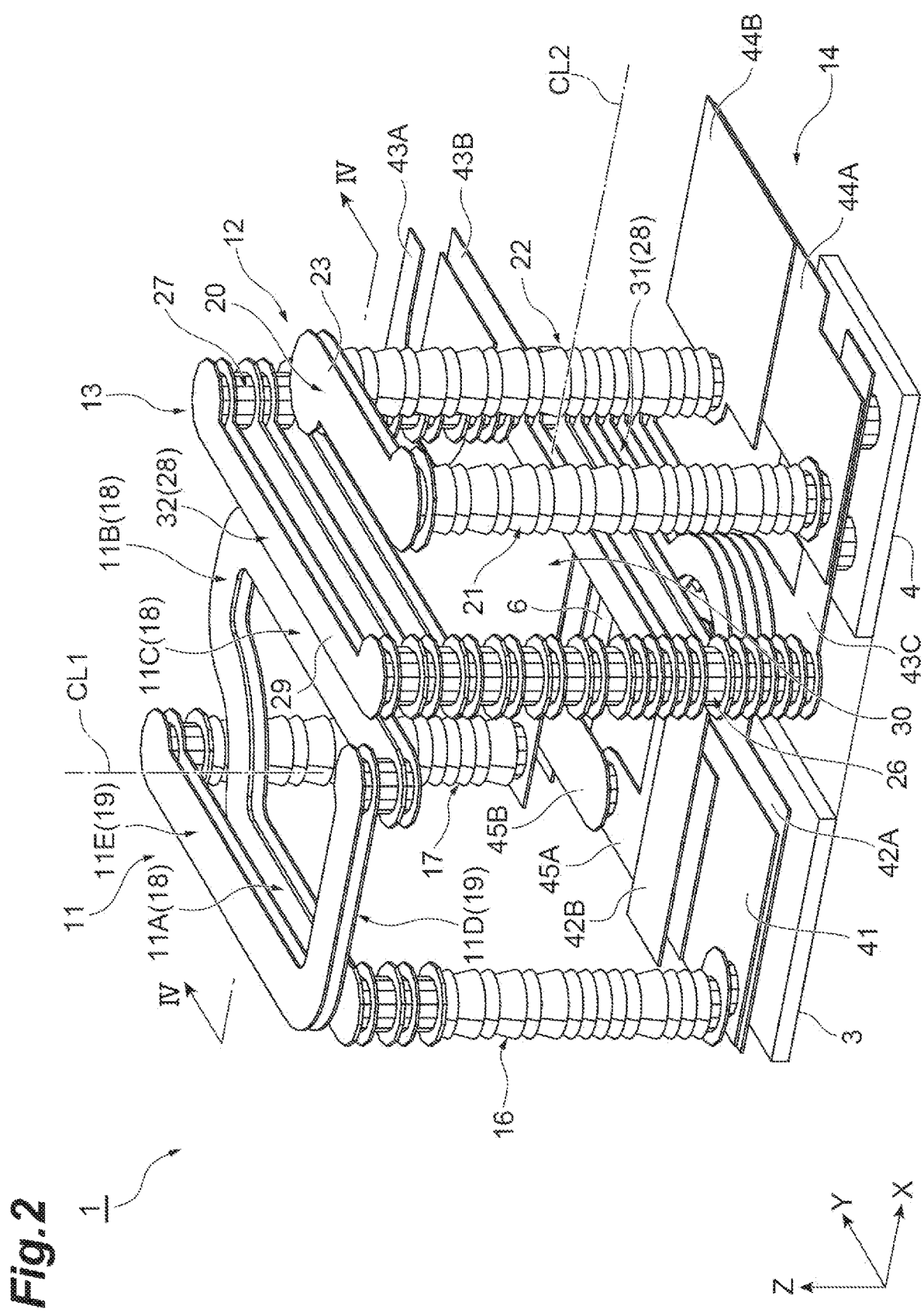
FIG. 2 is a perspective view showing an internal structure of an element body shown in FIG. 1.
Figure 3:
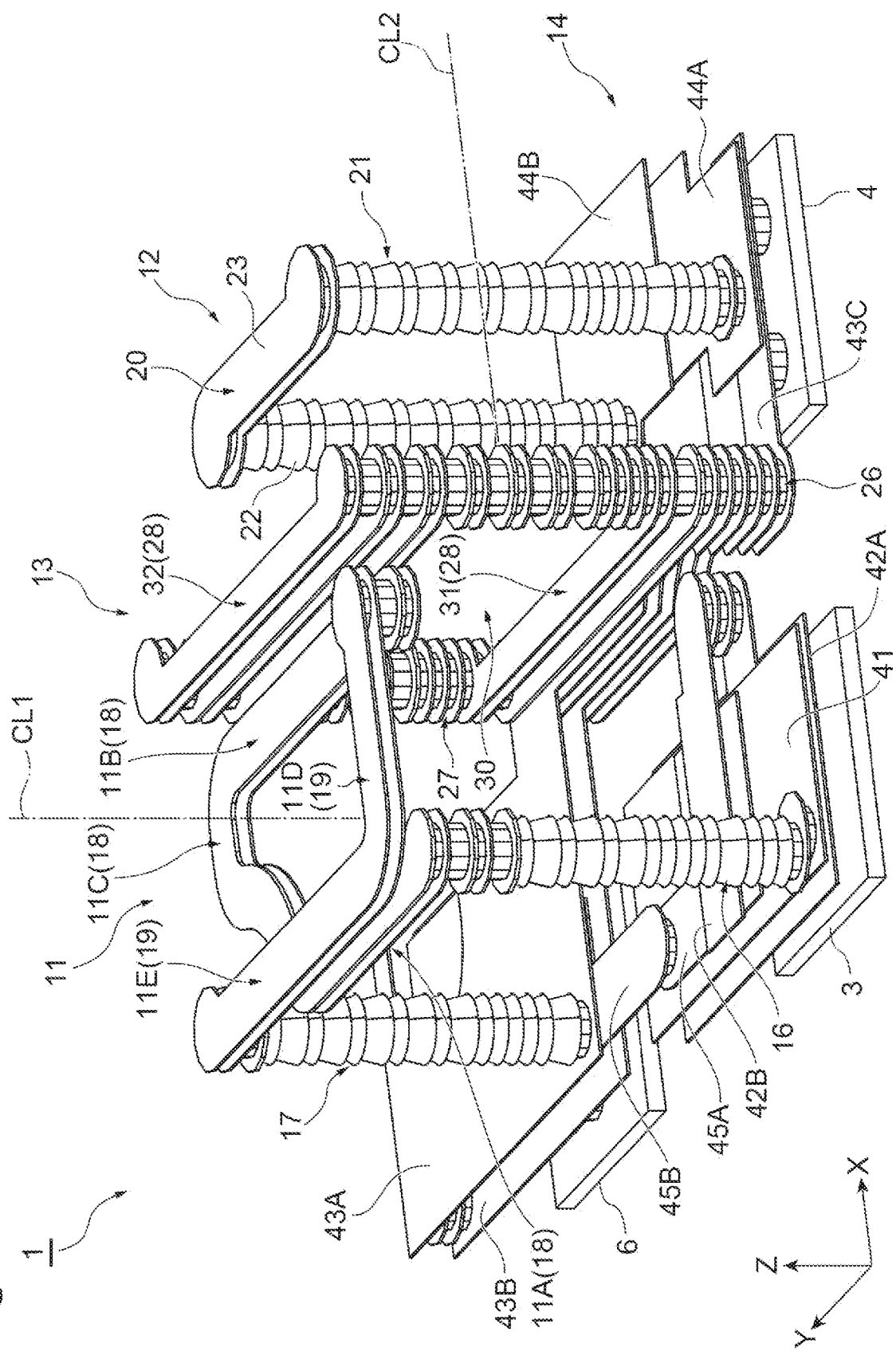
FIG. 3 is a perspective view showing the internal structure of the element body shown in FIG. 1.

FIGS. 2 and 3 are perspective views showing an internal structure of the element body 2 shown in FIG. 1. In FIGS. 2 and 3, the element body 2 is omitted. FIG. 4 is an enlarged cross-sectional view along line IV-IV in FIG. 2. Also, in FIG. 4, the element body 2 is shown without being omitted. As shown in FIGS. 2 and 3, the multilayer filter 1 includes a first inductor 11, a second inductor 12, a wall portion 13, and a connection structure 14. Also, in FIGS. 2 and 3, other conductors are omitted.

The first inductor 11 is a horizontal winding type inductor. A horizontal winding type inductor is an inductor of which a winding axis CL1 extends parallel to the Z axis direction (laminating direction). The first inductor 11 is configured by winding a conductor portion in a substantially rectangular annular shape around the winding axis CL1. Specifically, the first inductor 11 has side portions 11A, 11B, 11C, 11D, and 11E. The side portion 11A extends in the Y axis direction at a position on the negative side in the X axis direction with respect to the winding axis C1. The side portion 11B extends from an end portion of the side portion 11A to the positive side in the X axis direction at a position on the positive side in the Y axis direction with respect to the winding axis C1. The side portion 11C extends from an end portion of the side portion 11B to the negative side in the Y axis direction on the positive side in the X axis direction with respect to the winding axis C1. The side portion 11D extends from an end portion of the side portion 11C to the negative side in the X axis direction at a position on the negative side in the Y axis direction with respect to the winding axis C1. The side portion 11F extends from an end portion of the side portion 11D to the positive side in the Y axis direction on the negative side in the X axis direction with respect to the winding axis C1.

The side portions 11A, 11B, and 11C are configured of conductor patterns 18 formed on the same insulator layer 7 (see FIG. 4). The side portions 11D and 11E are configured of conductor patterns 19 formed on the insulator layer 7 on the positive side in the Z axis direction with respect to the conductor patterns 18. End portions of the conductor patterns 18 on the negative side in the Y axis direction of the side portion 11C are connected to end portions of the conductor patterns 19 on the positive side in the X axis direction of the side portion 11D via a through-hole conductor. The first inductor 11 has a pair of conductor patterns 18 having the same shape and a pair of conductor patterns 19 having the same shape, which face each other in the Z axis direction. The pair of conductor patterns 18 are electrically connected to each other at both end portions thereof via through-hole conductors. The pair of conductor patterns 19 are electrically connected to each other at both end portions via through-hole conductors.

The first inductor 11 is electrically connected to the connection structure 14 via a pillar portion 16 at an end portion of the side portion 11A on the negative side in the Y axis direction. The first inductor 11 is electrically connected to the connection structure 14 via a pillar portion 17 at an end portion of the side portion 11E on the positive side in the Y axis direction. The pillar portions 16 and 17 extend from end portions of the first inductor 11 to the negative side in the Z axis direction. The pillar portions 16 and 17 are configured by continuously connecting through-hole conductors, which pass through the insulator layers 7 (see FIG. 4), to each other in the Z axis direction.

The second inductor 12 is a vertical winding type inductor. A vertical winding type inductor is an inductor of which a winding axis CL2 extends in a direction perpendicular to the Z axis direction (laminating direction). In the present embodiment, the winding axis CL2 extends parallel to the X axis direction. The second inductor 12 is configured by winding a conductor portion in a portal shape around a winding axis CL2. Specifically, the second inductor 12 includes a wiring portion 20 and pillar portions 21 and 22. Also, the number of turns of the vertical winding type inductor is not particularly limited and may be two or more turns.

The wiring portion 20 extends in the Y axis direction at a position on the positive side in the Z axis direction with respect to the winding axis CL2. The wiring portion 20 is configured of conductor patterns 23 formed on the insulator layer 7 (see FIG. 4). The wiring portion 20 has a pair of conductor patterns 23 having the same shape facing each other in the Z axis direction. The pair of conductor patterns 23 are electrically connected to each other at both end portions thereof via through-hole conductors.

The pillar portion 21 extends in the Z axis direction at a position on the negative side in the Y axis direction with respect to the winding axis CL2. The pillar portion 21 electrically connects an end portion of the wiring portion 20 on the negative side in the Y axis direction to the connection structure 14. The pillar portion 21 is a member that extends from the end portion of the wiring portion 20 on the negative side in the Y axis direction toward the negative side in the Z axis direction. The pillar portion 22 extends in the Z axis direction at a position on the positive side in the Y axis direction with respect to winding axis CL2. The pillar portion 22 electrically connects an end portion of the wiring portion 20 on the positive side in the Y axis direction to the connection structure 14. The pillar portion 22 is a member that extends from the end portion of the wiring portion 20 on the positive side in the Y axis direction toward the negative side in the Z axis direction.

Here, the first inductor 11 and the second inductor 12 are in different bands. In the present embodiment, one of the first inductor 11 and the second inductor is a high-band inductor and the other is a mid-band inductor. A high-band inductor is an inductor that corresponds to a frequency band of 5150 to 7125 MHz. A mid-band inductor is an inductor that corresponds to a frequency band of 2400 to 2500 MHz. Further, in the present embodiment, the first inductor 11 is a mid-band inductor, and the second inductor 12 is a high-band inductor, but they are not particularly limited. Also, the first inductor 11 and the second inductor 12 may be inductors of the same band.

The wall portion 13 is a member that is disposed between the first inductor 11 and the second inductor 12 and grounded. The wall portion 13 extends parallel to the YZ plane with the X axis direction in which the first inductor 11 and the second inductor 12 face each other serving as its thickness direction. The wall portion 13 includes pillar portions 26 and 27 and wall plate members 28.

The pillar portion 26 extends in the Z axis direction at an end portion of the wall portion 13 on the negative side in the Y axis direction. The pillar portion 26 is electrically connected to the connection structure 14 at an end portion thereof on the negative side in the Z axis direction. The pillar portion 27 extends in the Z axis direction at an end portion of the wall portion 13 on the positive side in the Y axis direction. The pillar portion 27 is electrically connected to the connection structure 14 at and end portion thereof on the negative side in the Z axis direction.

The wall plate members 28 extend in the Y axis direction between the pillar portions 26 and 27. The wall plate members 28 are configured of conductor patterns 29 formed on the insulator layers 7 (see FIG. 4). The wall plate members 28 have a plurality of conductor patterns 29 of the same shape facing each other in the Z axis direction. The plurality of conductor patterns 29 are electrically connected to each other via the pillar portions 26 and 27 at both end portions thereof.

A penetrating portion 30 penetrating in the X axis direction, which is a facing direction in which the first inductor 11 and the second inductor 12 face each other, is formed in the wall portion 13. The penetrating portion 30 is formed by omitting the conductor pattern 29 from a partial region of the wall plate members 28 in the Z axis direction. The wall portion 13 has a first portion 31 on the negative side (one side) in the Z axis direction (laminating direction) from the penetrating portion 30, and a second portion 32 on the positive side (the other side) in the Z axis direction (laminating direction) from the penetrating portion 30. The first portion 31 is larger than the second portion in the Z axis direction.

The conductor pattern 29 of the first portion 31 on the most positive side in the Z axis direction and the conductor pattern 29 of the second portion 32 on the most negative side in the Z axis direction correspond to edge portions of the penetrating portion 30 in the Z axis direction. The pillar portion 26 and the pillar portion 27 correspond to edge portions of the penetrating portion 30 in the Y axis direction.

The connection structure 14 is a structure for electrically connecting the first inductor 11, the second inductor 12, and the wall portion 13 to the terminal electrodes 3, 4, and 6. In addition, the connection structure 14 is also a structure for forming a plurality of capacitors. The connection structure 14 has a plurality of plate-shaped internal electrodes. A lower end portion of the pillar portion 16 connected to the first inductor 11 is directly connected to an internal electrode 41. An internal electrode 42A is provided on the negative side of the internal electrode 41 in the Z axis direction. An internal electrode 42B is provided on the positive side of the internal electrode 41 in the Z axis direction. The internal electrode 42A is directly connected to the terminal electrode 3 by a through-hole conductor. The internal electrode 42B is directly connected to the internal electrode 42A by a through-hole conductor.

A lower end portion of the pillar portion 17 connected to the first inductor 11 is directly connected to an internal electrode 43A. An internal electrode 43B is provided on the negative side of the internal electrode 43A in the Z axis direction. The internal electrode 43B is directly connected to the internal electrode 43A and the terminal electrode 6 by through-hole conductors. The internal electrode 45A is provided between the internal electrodes 41 and 42B. Also, the internal electrode 45B is provided between the internal electrodes 43A and 43B. The internal electrode 45B is directly connected to the internal electrode 45A by the through-hole conductor. In addition, the internal electrode 43B is integrated with the third conductor pattern 29 from the negative side of the wall portion 13 in the Z axis direction. Further, an internal electrode 43C extends from the first conductor pattern 29 from the negative side of the wall portion 13 in the Z axis direction. The internal electrode 43C is directly connected with the terminal electrode 4 by a through-hole conductor.

A lower end portion of the pillar portion 21 of the second inductor 12 is directly connected to an internal electrode 44A. The internal electrode 44A faces the internal electrode 43C on the positive side in the Z axis direction. A lower end portion of the pillar portion 22 of the second inductor 12 is directly connected to an internal electrode 44B. The internal electrode 44B faces the internal electrode 44A on the positive side in the Z axis direction.

Figure 5:
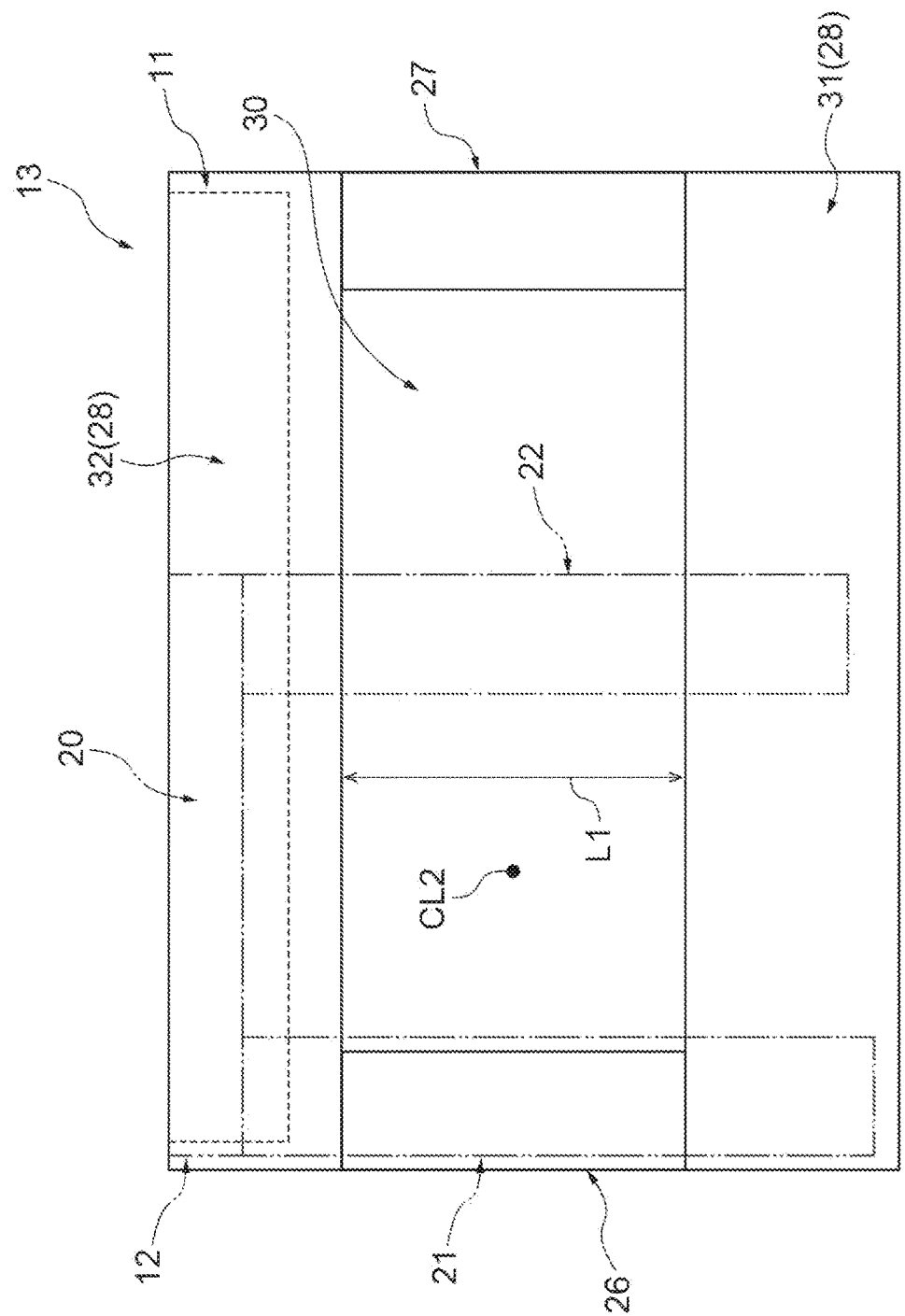
FIG. 5 is a schematic view of a wall portion from an X axis direction.
Figure 6:
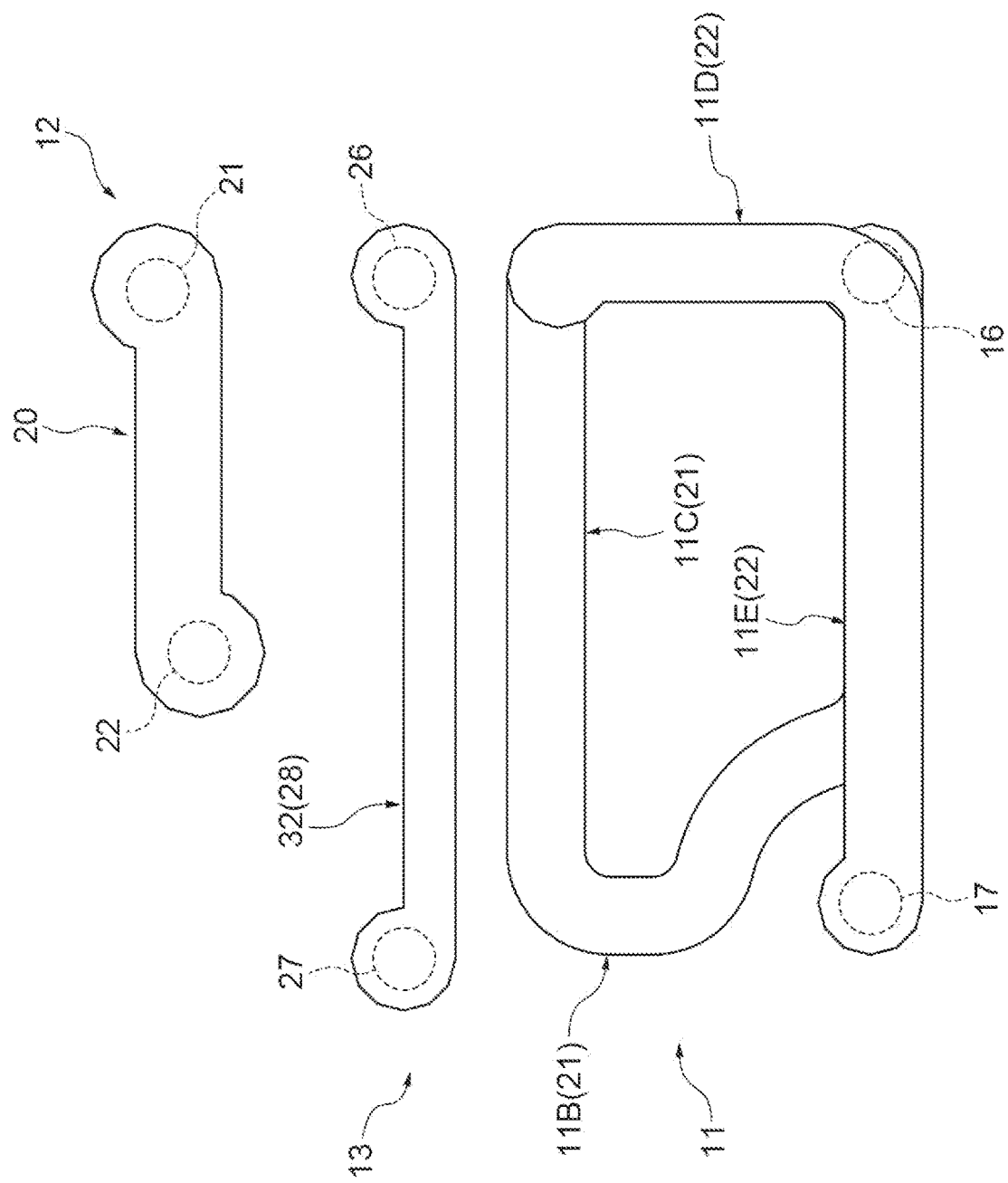
FIG. 6 is a plan view of a first inductor, a second inductor, and the wall portion from a positive side in a Z axis direction.

Next, positional correlations between the first inductor 11, the second inductor 12, and the wall portion 13 will be described in more detail with reference to FIGS. 4 to 6. FIG. 5 is a schematic diagram of the wall portion 13 when viewed in the X axis direction. FIG. 6 is a plan view of the first inductor 11, the second inductor 12, and the wall portion 13 from the positive side in the Z axis direction.

As shown in FIG. 4, the wall plate members 28 of the wall portion 13 are configured of the conductor patterns 29 provided for each insulator layer 7. Accordingly, the conductor patterns 29 are separated from each other in the Z axis direction, forming gaps. However, the multilayer filter 1 is a component for handling high frequencies, and thus for the first inductor 11 and the second inductor 12, the wall plate members 28 are configured to separate both electrically and magnetically.

On the other hand, in the Z axis direction, a size of the penetrating portion 30 is larger than a size of one insulator layer 7. As shown in FIG. 5, a size L1 of the penetrating portion 30 in the Z axis direction is larger than a size of the first inductor 11 and a size of the wiring portion 20 of the second inductor 12. The penetrating portion 30 is positioned and sized to overlap the winding axis CL2 of the second inductor 12 when viewed in the X axis direction. Although not particularly limited, the size L1 of the penetrating portion 30 in the Z axis direction may be set to approximately 0.1 to 0.5 mm.

The wiring portion 20 of the second inductor 12 overlaps the second portion 32 of the wall portion 13 when viewed in the X axis direction. The entire wiring portion 20 of the second inductor 12 overlaps the second portion 32 of the wall portion 13 when viewed in the X axis direction. Also, when viewed in the X axis direction, the first inductor 11 overlaps the second portion 32 of the wall portion 13. The entire area of the first inductor 11 overlaps the second portion 32 of the wall portion 13 when viewed in the X axis direction. The pillar portion 21 of the second inductor 12 is disposed at a position on the positive side from the end portion of the wall portion 13 on the negative side in the Y axis direction. The pillar portion 21 of the second inductor 12 is disposed at a position overlapping the pillar portion 26 of the wall portion 13 when viewed in the X axis direction. The pillar portion 22 of the second inductor 12 is disposed near a central position of the wall portion 13 when viewed in the X axis direction.

As shown in FIG. 6, the side portion 11C of the first inductor 11 is disposed at a position separated from the wall portion 13 toward the negative side in the X axis direction. The wiring portion 20 of the second inductor 12 is disposed at a position separated from the wall portion 13 toward the positive side in the X axis direction. The side portion 11C of the first inductor 11 is disposed at a position closer to the wall portion 13 than the wiring portion 20 of the second inductor 12 is.

Next, operations and effects of the multilayer filter 1 according to the present embodiment will be described.

In this multilayer filter 1, at least the second inductor 12 is a vertical winding type inductor of which the winding axis CL2 extends in the direction orthogonal to the laminating direction in which the plurality of insulator layers 7 are laminated. By using such a vertical winding coil, the multilayer filter 1 can obtain high in-band insertion loss characteristics. In addition, the multilayer filter 1 includes the wall portion 13 disposed between the first inductor 11 and the second inductor 12 and grounded. Accordingly, electromagnetic coupling between the first inductor 11 and the second inductor 12 can be inhibited. Here, the penetrating portion 30 penetrating in the facing direction in which the first inductor 11 and the second inductor 12 face each other is formed in the wall portion 13. Further, in the laminating direction, the size of the penetrating portion 30 is larger than the size of one insulator layer 7. Since the wall portion 13 has the large penetrating portion 30, magnetic flux of the second inductor 12, which is a vertical winding type inductor, can pass through the penetrating portion 30. Accordingly, it is possible to inhibit obstruction to the magnetic flux of the second inductor 12 and improve the Q factor. In this way, performance of the multilayer filter 1 can be improved.

The terminal electrodes 3, 4, and 6 may be formed on one side of the element body 2 in the laminating direction, the wall portion 13 may have the first portion 31 on one side of the penetrating portion 30 in the laminating direction and the second portion 32 on the other side of the penetrating portion 30 in the laminating direction, and the first portion 31 may be larger than the second portion 32 in the laminating direction. Since the terminal electrodes 3, 4, and 6 are formed on the one side of the element body 2 in the laminating direction, there are many electrodes. Accordingly, by enlarging the first portion 31 on one side of the wall portion 13 in the laminating direction, it is possible to inhibit occurrence of stray capacitance between the electrodes on one side and the other side of the wall portion 13.

The first inductor 11 and the second inductor 12 may be in different bands. In this case, the wall portion 13 can inhibit coupling between the inductors of different bands.

One of the first inductor 11 and the second inductor 12 may be a high-band inductor, and the other may be a mid-band inductor. In this case, deterioration of isolation characteristics, which is a problem in so-called multiplexers, can be inhibited.

The terminal electrodes 3, 4, and 6 may be formed on one side of the element body 2 in the laminating direction, the wall portion 13 may have the second portion 32 on the other side in the laminating direction from the penetrating portion 30, the second inductor 12 may have the wiring portion 20 disposed on the other side in the laminating direction, and the wiring portion 20 may overlap the second portion 32 when viewed in the facing direction. In this case, electromagnetic coupling between the wiring portion 20 of the second inductor 12 and the first inductor 11 can be inhibited.

Figure 7:
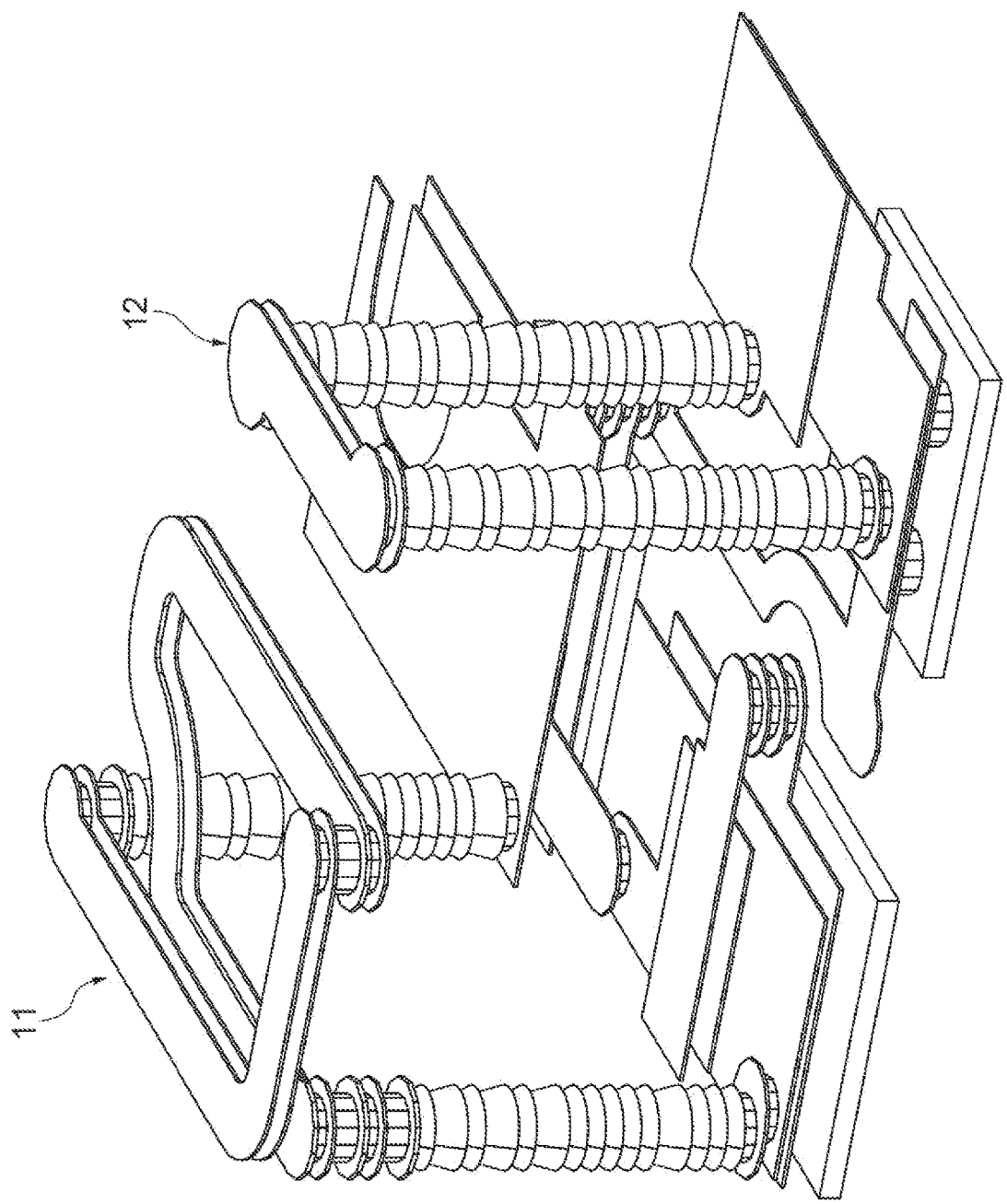
FIG. 7 is a perspective view showing an internal structure of a multilayer filter according to a comparative example.
Figure 8:
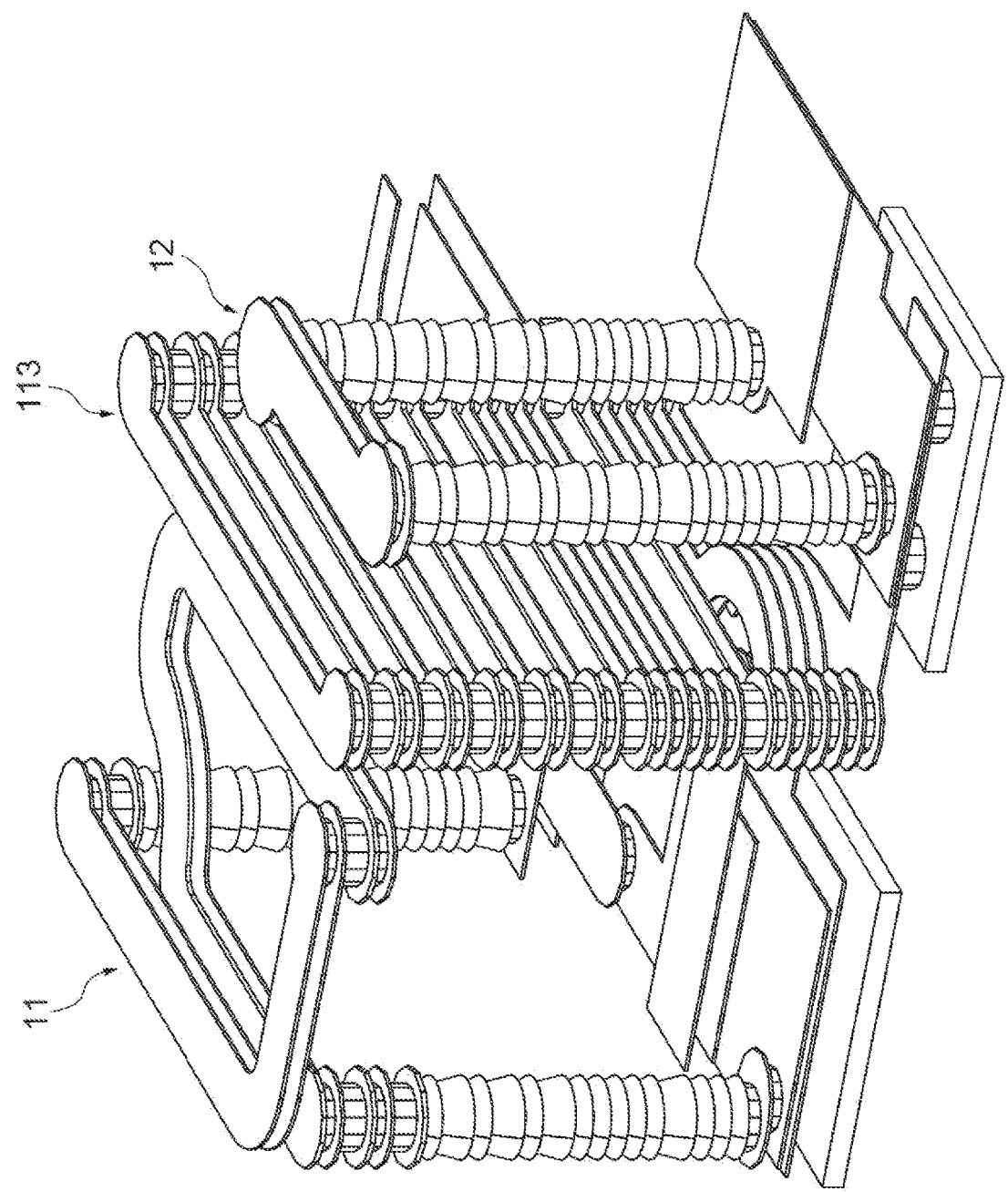
FIG. 8 is a perspective view showing an internal structure of a multilayer filter according to a comparative example.
Figure 9A:
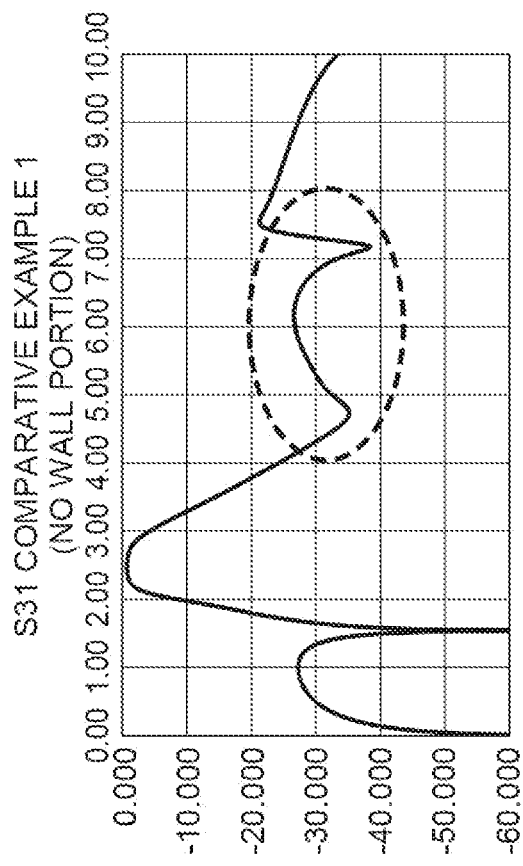
FIG. 9A shows measurement results of Comparative Example 1.
Figure 9C:
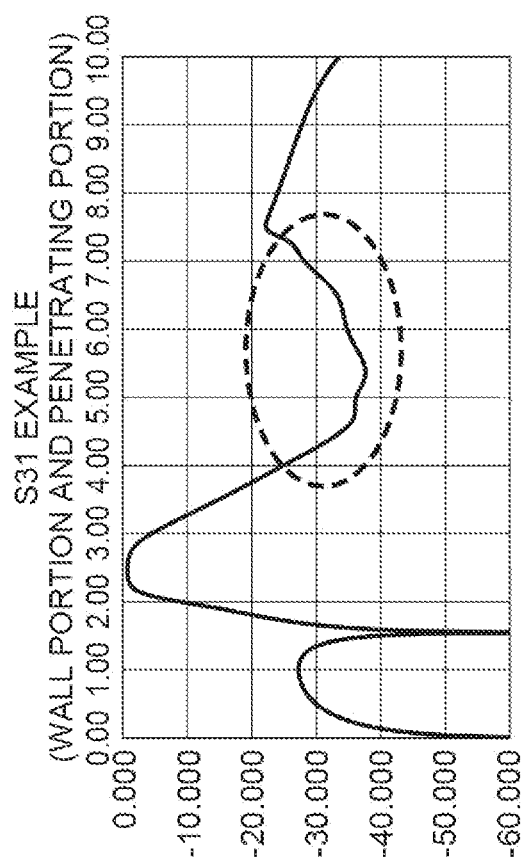
FIG. 9C shows measurement results of an example.
Figure 9B:
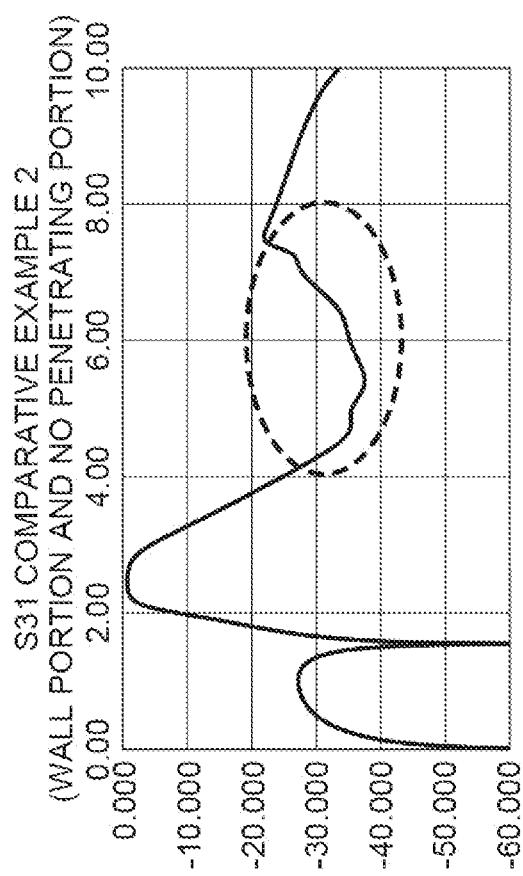
FIG. 9B shows measurement results of Comparative Example 2.
Figure 10A:
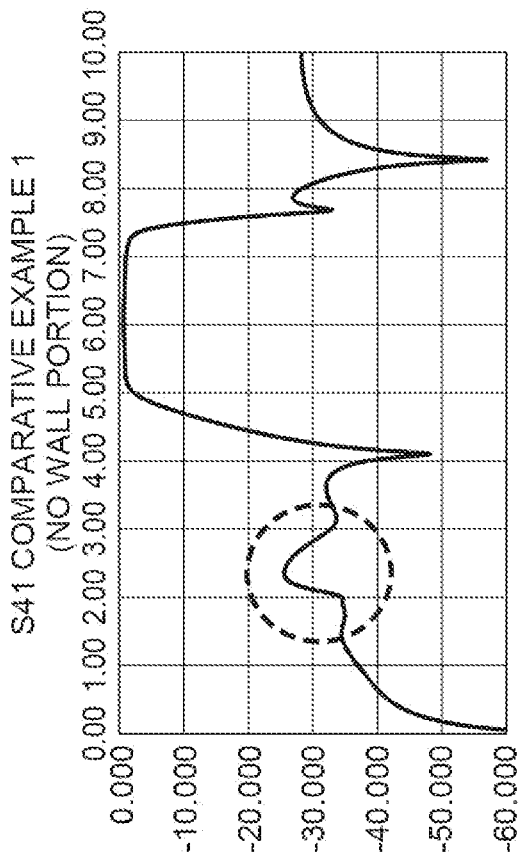
FIG. 10A shows measurement results of Comparative Example 1.
Figure 10C:
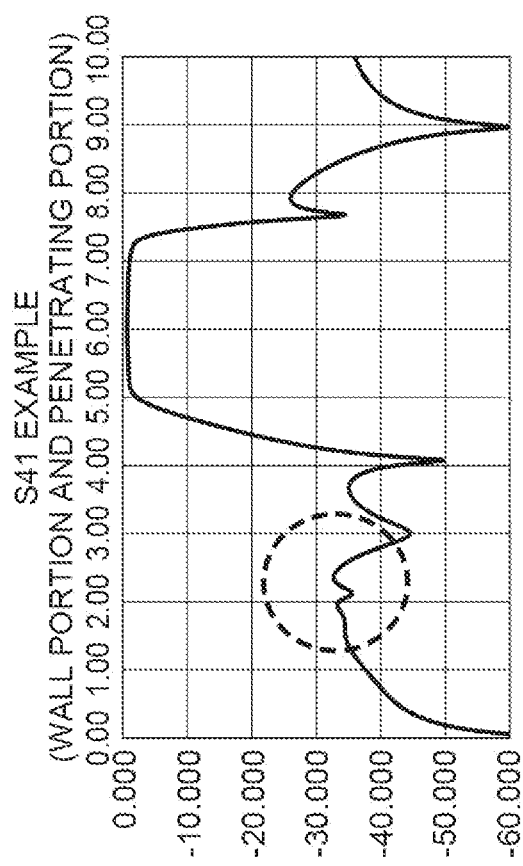
FIG. 10C shows measurement results of the example.
Figure 10B:
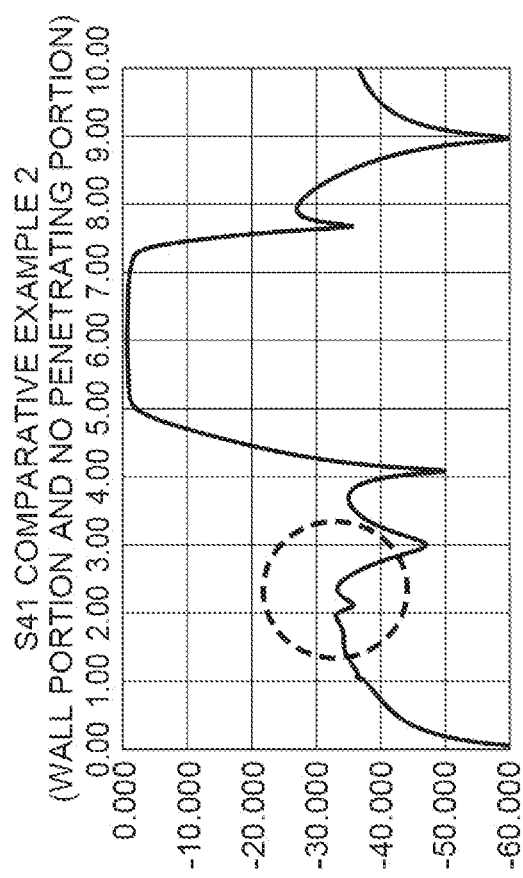
FIG. 10B shows measurement results of Comparative Example 2.
Figure 11A:
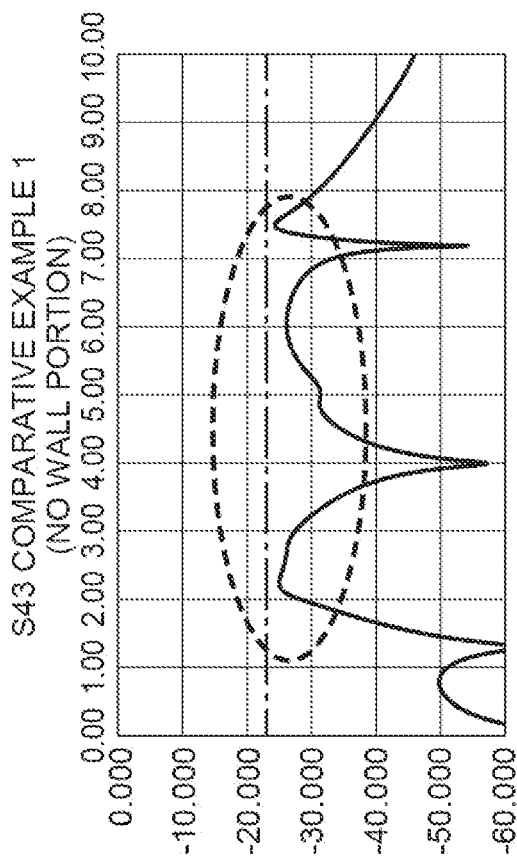
FIG. 11A shows measurement results of Comparative Example 1.
Figure 11C:
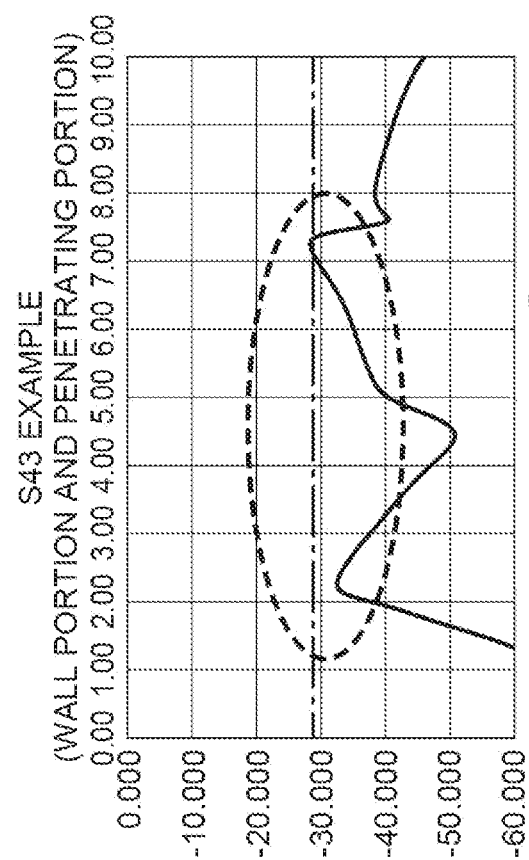
FIG. 11C shows measurement results of the example.
Figure 11B:
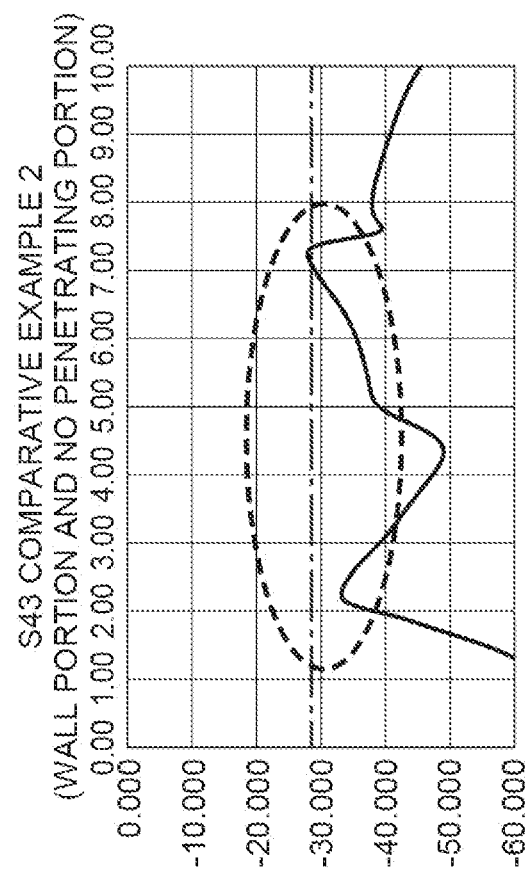
FIG. 11B shows measurement results of Comparative Example 2.
Figure 12:
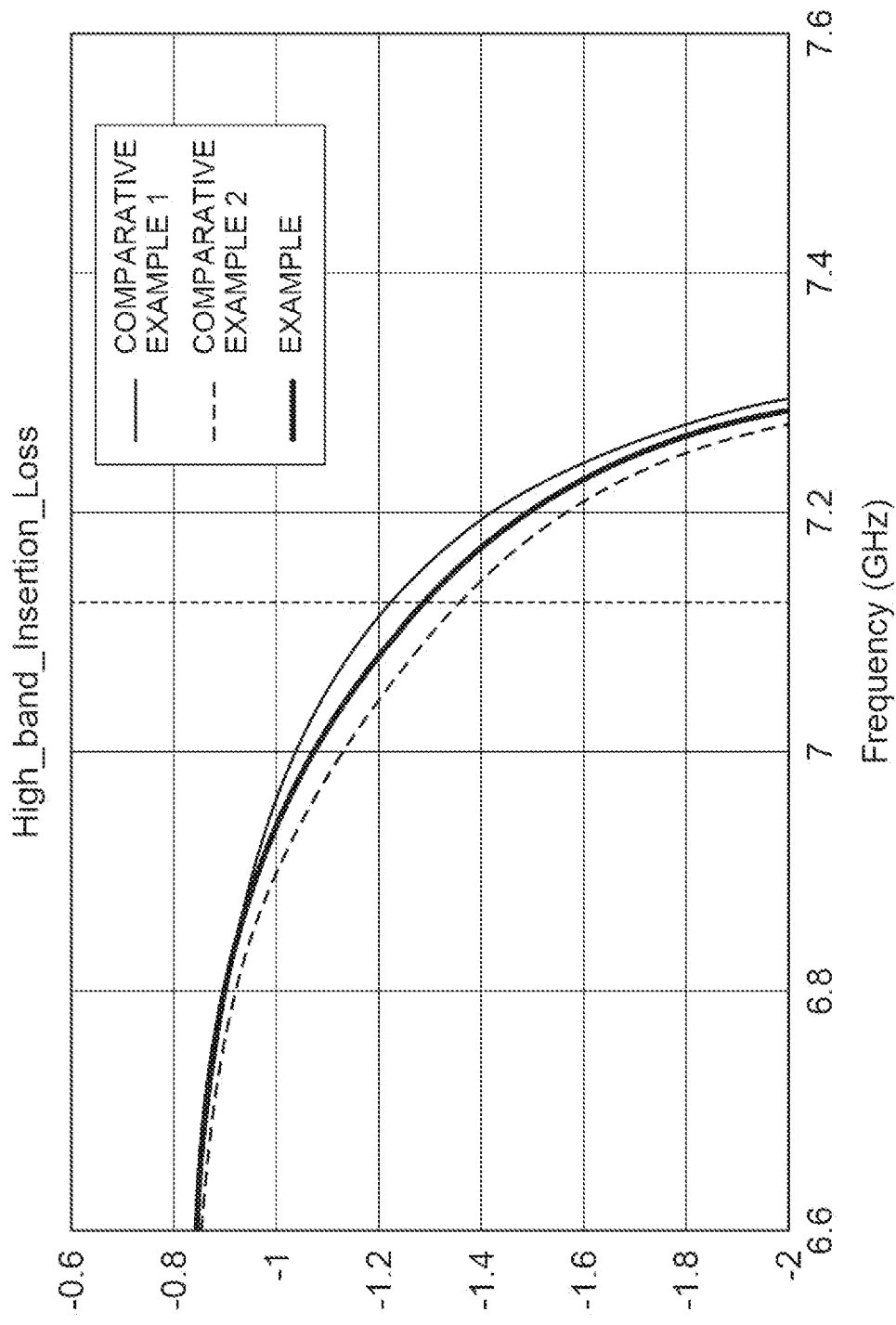
FIG. 12 shows simulation results of Comparative Example 1, Comparative Example 2, and the example.

Next, an example and comparative examples will be described with reference to FIGS. 7 to 12. As Comparative Example 1, as shown in FIG. 7, a multilayer filter having no wall portion was prepared. As Comparative Example 2, as shown in FIG. 8, a multilayer filter having a wall portion 113 without an opening portion was prepared. Also, in Comparative Examples 1 and 2, structures other than the wall portion are the same as those of the example. As the example, a multilayer filter shown in FIG. 2 was prepared. Results of measuring characteristics of these multilayer filters are shown in FIGS. 9A, 9B, 9C to 12. FIG. 9A shows measurement results of Comparative Example 1, FIG. 9B shows measurement results of Comparative Example 2, and FIG. 9C shows measurement results of the example. In FIGS. 9A, 9B, 9C to 11A, 11B, 11C the vertical axis is decibel (dB), and the horizontal axis is frequency (GHz). In addition, FIGS. 9A, 9B, 9C show attenuation characteristics of "S31," and FIGS. 10A, 10B, 10C show attenuation characteristics of "S41." In Comparative Example 1 of FIGS. 9A and 10A, peaks are formed in portions surrounded by dashed lines, but as shown in FIGS. 9B, 9C, 10B, and 10C, no peak is formed in Comparative Example 2 and the example having the wall portions. Further, FIGS. 11A, 11B, 11C show isolation characteristic of "S43." As shown in FIGS. 11A, 11B, and 11C, as compared to Comparative Example 1, Comparative Example 2 and the example having the wall portions have improved isolation characteristics at 2400 to 2500 MHz and 5150 to 7125 MHz. FIG. 12 shows simulation results of insertion loss characteristics. As shown in FIG. 12, Comparative Example 1 has the best insertion loss characteristics, but Comparative Example 1 has poor isolation characteristics as described above. In Comparative Example 2, although the isolation characteristics are improved by providing the wall portion, the insertion loss characteristics are degraded. On the other hand, in the example, in addition to improving the isolation characteristics, deterioration of the insertion loss characteristics can be inhibited.

The present invention is not limited to the above-described embodiment.

For example, in the above-described embodiment, one inductor is a horizontal winding type inductor and the other inductor is a vertical winding type inductor, but arrangement of them may be reversed. Also, both of them may be vertical winding type inductors. In addition, the number of inductors is not limited, and three or more inductors may be provided. In this case, wall portions may be provided between each inductor.

1. A multilayer filter comprising:
    an element body formed by laminating a plurality of insulator layers;
    a first inductor and a second inductor; and
    a wall portion disposed between the first inductor and the second inductor and grounded,
    wherein at least the second inductor is a vertical winding type inductor of which a winding axis extends in a direction orthogonal to a laminating direction in which the plurality of insulator layers are laminated,
    a penetrating portion penetrating in a facing direction in which the first inductor and the second inductor face each other is formed in the wall portion, and
    a size of the penetrating portion in the laminating direction is larger than a size of one insulator layer.

2. The multilayer filter according to embodiment 1,
    wherein terminal electrodes are formed on one side of the element body in the laminating direction,
    the wall portion includes a first portion on one side in the laminating direction from the penetrating portion and a second portion on the other side in the laminating direction from the penetrating portion, and
    the first portion is larger than the second portion in the laminating direction.

3. The multilayer filter according to embodiment 1 or 2, wherein the first inductor and the second inductor are in different bands.

4. The multilayer filter according to any one of embodiments 1 to 3, wherein one of the first inductor and the second inductor is a high-band inductor, and the other is a mid-band inductor.

5. The multilayer filter according to any one of embodiments 1 to 4,
    wherein terminal electrodes are formed on one side of the element body in the laminating direction,
    the wall portion includes a second portion on the other side in the laminating direction from the penetrating portion,
    the second inductor includes a wiring portion disposed on the other side in the laminating direction, and
    the wiring portion overlaps the second portion when viewed in the facing direction.

REFERENCE SIGNS LIST

1 Multilayer filter
2 Element body
3, 4, 6 Terminal electrode
7 Insulator layer
11 First inductor
12 Second inductor
13 Wall portion
20 Wiring portion
30 Penetrating portion
31 First portion
32 Second portion

What is claimed is:
1. A multilayer filter comprising:
    an element body formed by laminating a plurality of insulator layers;
    a first inductor and a second inductor; and
    a wall portion disposed between the first inductor and the second inductor and grounded,
    wherein at least the second inductor is a vertical winding type inductor of which a winding axis extends in a direction orthogonal to a laminating direction in which the plurality of insulator layers are laminated,
    a penetrating portion penetrating in a facing direction in which the first inductor and the second inductor face each other is formed in the wall portion, and
    a size of the penetrating portion in the laminating direction is larger than a size of one insulator layer.

2. The multilayer filter according to claim 1,
wherein terminal electrodes are formed on one side of the element body in the laminating direction,
the wall portion includes a first portion on one side in the laminating direction from the penetrating portion and a second portion on the other side in the laminating direction from the penetrating portion, and
the first portion is larger than the second portion in the laminating direction.

3. The multilayer filter according to claim 1, wherein the first inductor and the second inductor are in different bands.

4. The multilayer filter according to claim 1, wherein one of the first inductor and the second inductor is a high-band inductor, and the other is a mid-band inductor.

5. The multilayer filter according to claim 1,
wherein terminal electrodes are formed on one side of the element body in the laminating direction,
the wall portion includes a second portion on the other side in the laminating direction from the penetrating portion,
the second inductor includes a wiring portion disposed on the other side in the laminating direction, and
the wiring portion overlaps the second portion when viewed in the facing direction.

* * * * *